United States Patent
Orii et al.

(10) Patent No.: US 8,651,121 B2
(45) Date of Patent: Feb. 18, 2014

(54) SUBSTRATE PROCESSING APPARATUS, SUBSTRATE PROCESSING METHOD, AND STORAGE MEDIUM

(75) Inventors: Takehiko Orii, Tosu (JP); Kenji Sekiguchi, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 977 days.

(21) Appl. No.: 12/372,265

(22) Filed: Feb. 17, 2009

(65) Prior Publication Data

US 2009/0205684 A1 Aug. 20, 2009

(30) Foreign Application Priority Data

Feb. 15, 2008 (JP) .................................. 2008-34489
Dec. 11, 2008 (JP) .................................. 2008-315721

(51) Int. Cl.
*B08B 3/00* (2006.01)

(52) U.S. Cl.
USPC ........ 134/134; 134/59 R; 134/94.1; 134/95.1; 134/95.2; 134/95.3; 15/3

(58) Field of Classification Search
None
See application file for complete search history.

(56) References Cited

FOREIGN PATENT DOCUMENTS

| JP | 6-9130 U | 2/1994 |
|---|---|---|
| JP | 08-316190 A | 11/1996 |
| JP | 2002273360 A | * 9/2002 |
| JP | 2003-133278 A | 5/2003 |
| JP | 2004-349470 A | 12/2004 |
| JP | 2007-263485 A | 10/2007 |
| JP | 2007-306029 A | 11/2007 |
| JP | 2009-158565 A | 7/2009 |

OTHER PUBLICATIONS

JPO machine translation of JP 2004349470, retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=2004-349470 on Nov. 11, 2011.*
JPO machine translation of JP 2002273360, retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=2002-273360 on Nov. 14, 2011.*
JPO machine translation of JP 2007263485, retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=2007-263485 on Nov. 11, 2011.*
An Office Action dated Apr. 16, 2012, issued from the Japanese Patent Office (JPO) of Japanese Patent Application No. 2008-315721 and a partial English translation thereof.

* cited by examiner

*Primary Examiner* — Eric Golightly
(74) *Attorney, Agent, or Firm* — Abelman, Frayne & Schwab

(57) ABSTRACT

A substrate processing apparatus includes a chamber configured to dispose a substrate to be processed with a substrate holder, a spin chuck to rotate the substrate, a gas discharging head configured to discharge a dehumidified gas to the substrate, a processing liquid supply nozzle, an IPA supply nozzle, and a driving device configured to move the gas discharging head between a retreat position of an upper part of the chamber and an approach position near the substrate. In particular, the gas discharging head is positioned at the approach position when the IPA is supplied to the substrate so that the dehumidified gas is supplied from the gas discharging head to the substrate when the IPA is supplied to the substrate.

9 Claims, 13 Drawing Sheets

000
SUBSTRATE PROCESSING APPARATUS, SUBSTRATE PROCESSING METHOD, AND STORAGE MEDIUM

This application is based on and claims priority from Japanese Patent Application Nos. 2008-34489, filed on Feb. 15, 2008 and 2008-315721, filed on Dec. 11, 2008, in the Japanese Patent Office, the disclosures of which are incorporated herein in their entirety by reference.

TECHNICAL FIELD

The present invention relates to the substrate processing apparatus, method and storage medium capable of performing a liquid processing of a substrate.

BACKGROUND

Semiconductor device manufacturing processes include cleaning semiconductor wafers (hereinafter, briefly referred to as wafers) by processing liquid, such as a chemical solution or a rinsing solution. A cleaning processing includes supplying a chemical solution, such as DHF solution (diluted HF) to a wafer to process the wafer with the chemical solution, supplying a rinsing solution, such as deionized water to the wafer to process the wafer with the rising solution, and drying the wafer.

Conventionally, a wafer drying method includes, for example, a vapor drying method in which a wafer is dried with vapor of organic solvents, such as IPA (isopropyl alcohol), while rotating the wafer. Also, a dehumidified air (low humidity air) may be supplied to a wafer in order to suppress generation of watermarks, thereby reducing the humidity around the wafer. One example of supplying a dehumidified air is disclosed in Japanese Utility Model Laid-Open Publication No. P6-9130. However, because a dehumidified air always has to be supplied to the surroundings of the wafer during the drying processing, a wafer processing cost is increased.

Japanese Patent Laid-Open Publication No. 2007-263485 discloses supplying a low humidity air, such as IPA, as a drying solvent, only when it is required. According to this method, a time for supplying a low humidity air can be reduced, and thus a wafer processing cost is reduced, in comparison with the method disclosed in Japanese Utility Model Laid-Open Publication No. P6-9130.

However, even in the method disclosed in the Japanese Patent Laid-Open Publication No. 2007-263485, a low humidity air must fill out a chamber when the air is supplied. Therefore, a considerable amount of low humidity air is still required. Accordingly, a need to reduce an amount of low humidity air is still required.

Japanese Patent Laid-Open Publication No. 2004-349470 discloses supplying a dry air (low humidity air) to a chamber in which a substrate is received, the substrate having been processed with a cleaning solution. Thus, the evaporation of the cleaning solution can be accelerated and the generation of watermark can be suppressed. However, this method still requires filing a chamber with a low humidity air. Therefore, a considerable amount of low humidity air is still required, and the reduction of an amount of the low humidity air is required.

SUMMARY

The present invention provides a substrate process apparatus in which a low humidity gas is introduced into a chamber in order to prevent watermarks from generating on a substrate, thereby reducing the supply quantity of a low humidity gas. Moreover, the present invention provides a substrate processing method using a substrate processing apparatus. Also, the present invention provides a storage medium storing a program to execute a substrate processing method.

According to one example, a substrate processing apparatus is provided the substrate processing apparatus includes a chamber to receive a substrate; a substrate holding part to horizontally hold the substrate within the chamber; a rotating device to rotate the substrate holding part; a gas discharging head provided on an upper side of the substrate holding part within the chamber and configured to move up and down, the gas discharging head discharging either a low humidity gas or a clean air into a lower side in the chamber; a gas supplying device to supply either the low humidity gas or the clean air to the gas discharging head; a driving device to move the gas discharging head between a retreat position at an upper part of the chamber and an approach position near the substrate held by the substrate holding part; a processing liquid supply nozzle to supply a processing liquid to the substrate held by the substrate holding part; and a dry organic solvent supply nozzle to supply dry organic solvent to the substrate held by the substrate holding part, wherein the processing liquid is supplied from the processing liquid supply nozzle to the substrate held by the substrate holding part to perform liquid processing of the substrate, and a series of processes is performed to dry the substrate by supplying the dry organic solvent from the dry organic solvent supply nozzle to the substrate, and wherein the gas discharging head is positioned at the approach position to supply the low humidity gas from the gas discharging head to the substrate at least when the dry organic solvent is supplied, and the gas discharging head is positioned at the retreat position to supply the clean air from the gas discharging head to the wafer when the low humidity gas is not supplied.

The dry organic solvent supply nozzle may be scanned from a center of the substrate to an edge of the substrate and may discharge the dry organic solvent while the substrate is rotated. A nitrogen gas nozzle may be provided near the dry organic solvent supply nozzle, and the scan of a nitrogen may follow the scan of the organic solvent, when the dry organic solvent supply nozzle is scanned from the center of the substrate to the edge of the substrate and may discharge the dry organic solvent while the substrate is rotated.

After the dry organic solvent is supplied from the dry organic solvent supply nozzle to the substrate, a spin drying may be performed in a state where no nozzle exists on the substrate, and the gas discharging nozzle may approach closer to the substrate.

Also, the gas discharging head may include a cutout which can be scanned by the dry organic solvent supply nozzle, and when the gas discharging head is positioned at the approach position, the dry organic solvent supply nozzle may scan an inside the cutout. The dry organic solvent supply nozzle may be attached onto the gas discharging head.

According to second example, a substrate processing apparatus is provided. The substrate processing apparatus includes a chamber to receive a substrate; a substrate holding part to horizontally hold the substrate within the chamber, a rotating device to rotate the substrate holding part; a gas discharging head provided on an upper side of the substrate holding part within the chamber and configured to move up and down, the gas discharging head discharging either a low humidity gas or a clean air to a lower side within the chamber; a gas supplying device to supply either of low humidity gas or clean air to the gas discharging head; a driving device to move the gas discharging head between a retreat position at an upper part of the chamber and an approach position adjacent to the substrate held by the substrate holding part; and a processing liquid supply nozzle to supply a processing liquid to the substrate held by the substrate holding part, wherein the processing liquid is supplied from the processing liquid supply nozzle to the substrate held by the substrate holding part to perform liquid processing of the substrate, and a series of processes is performed to dry the substrate while rotating the substrate, and wherein the gas discharging head is positioned at the approach position to supply the low humidity gas from the gas discharging head to the substrate at least when the substrate is dried, and the gas discharging head is positioned at the retreat position to supply the clean air from the gas discharging head to the substrate when the low humidity gas is not supplied to the substrate.

The substrate processing apparatus may further comprise a nitrogen gas nozzle configured to scan, and the scan of the nitrogen gas nozzle is performed from a center of the substrate to an edge of the substrate while rotating the substrate, when the substrate is dried. The gas discharging head may include a cutout which can be scanned by the nitrogen gas nozzle, and when the gas discharging head is positioned at the approach position, the nitrogen gas nozzle scans the inside the cutout.

According to third example, a substrate processing method is provided. The substrate processing method includes horizontally holding a substrate within a chamber receiving the substrate; supplying a processing liquid from a processing liquid supply nozzle to the substrate while rotating the substrate to perform a liquid processing of the substrate; and supplying a dry organic solvent from a dry organic solvent supply nozzle to the substrate to dry the substrate, wherein a gas discharging head is provided to be configured to move between a retreat position at an upper part of the chamber and an approach position adjacent to the substrate held within the chamber to selectively discharge a clean air or a low humidity gas, and wherein the gas discharging head is positioned at the approach position to supply the low humidity gas from the gas discharging head to the substrate at least when the dry organic solvent is supplied to the substrate, and the gas discharging head is positioned at the retreat position to supply the clean air from the gas discharging head to the substrate when the low humidity gas is not supplied to the substrate.

The dry organic solvent supply nozzle may discharge the dry organic solvent while scanning from a center of the substrate to an edge of the substrate in a state that the substrate is rotated. A nitrogen gas nozzle may be provided near the dry organic solvent supply nozzle, and the scan of a nitrogen gas may follow the scan of the dry organic solvent when the dry organic solvent supply nozzle discharges the dry organic solvent while scanning from the center of the substrate to the edge of the substrate in a state that the substrate is rotated.

Also, after drying is performed the by supplying a dry organic solvent from the dry organic solvent supply nozzle to the substrate, a spin drying may be performed in a state where no nozzle exists on the substrate, and at this time, the gas discharging nozzle may approach closer to the substrate.

The method may further comprise cleaning the substrate by supplying a chemical solution from the processing liquid supply nozzle to the substrate; rinsing the cleaned substrate by supplying a rinsing solution from the processing liquid supply nozzle to the substrate; and further drying the substrate with the dry organic solvent.

According to fourth example, a substrate processing method is provided. The substrate processing method includes horizontally holding a substrate within a chamber receiving the substrate; supplying a processing liquid from a processing liquid supply nozzle to the substrate while rotating a substrate to perform a liquid processing of the substrate; and drying the substrate while rotating the substrate, wherein a gas discharging head is provided to be configured to move between a retreat position of an upper part of the chamber and an approach position adjacent to the substrate held within the chamber to selectively discharge a clean air or a low humidity gas, and wherein the gas discharging head is positioned at the approach position to supply the low humidity gas from the gas discharging head to the substrate at least when the substrate is dried, and the gas discharging head is positioned at the retreat position to supply the clean air from the gas discharging head to the substrate when the low humidity gas is not supplied to the substrate.

Also, a nitrogen gas nozzle may be provided, and the nitrogen gas nozzle may be scannable. The nitrogen gas nozzle may scan from the center of the substrate to the edge of the substrate in a state that the substrate is rotated when the substrate is dried.

The method may further comprise cleaning the substrate by supplying a chemical solution from the processing liquid supply nozzle to the substrate; rinsing the substrate by supplying a rinsing solution from the processing liquid supply nozzle to the substrate; and further drying the substrate.

According to fifth example, a storage medium is provided. The storage medium stores a program executed by a computer that controls a substrate processing apparatus, the program controlling the substrate processing apparatus through the computer so as to allow the substrate processing method of the third example to be performed when the program executed.

According to sixth example, a storage medium is provided. The storage medium stores a program executed by a computer that controls a substrate processing apparatus, the program controlling the substrate processing apparatus through the computer so as to allow the substrate processing method of the fourth example to be performed when the program executed.

According to the present invention, a gas discharging head is positioned at the approach position to supply a low humidity gas from the gas discharging head to a substrate when supplying a dry organic solvent to a substrate in order to dry the substrate with the dry organic solvent or at least when the substrate is dried by rotating the substrate. Thus, an amount of the low humidity gas or air can be reduced.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Examples of the present invention will be described in detail. A substrate processing apparatus, for example, a wafer cleaning apparatus to perform a cleaning process of a wafer will be described hereinafter.

First Example

Figure 1:
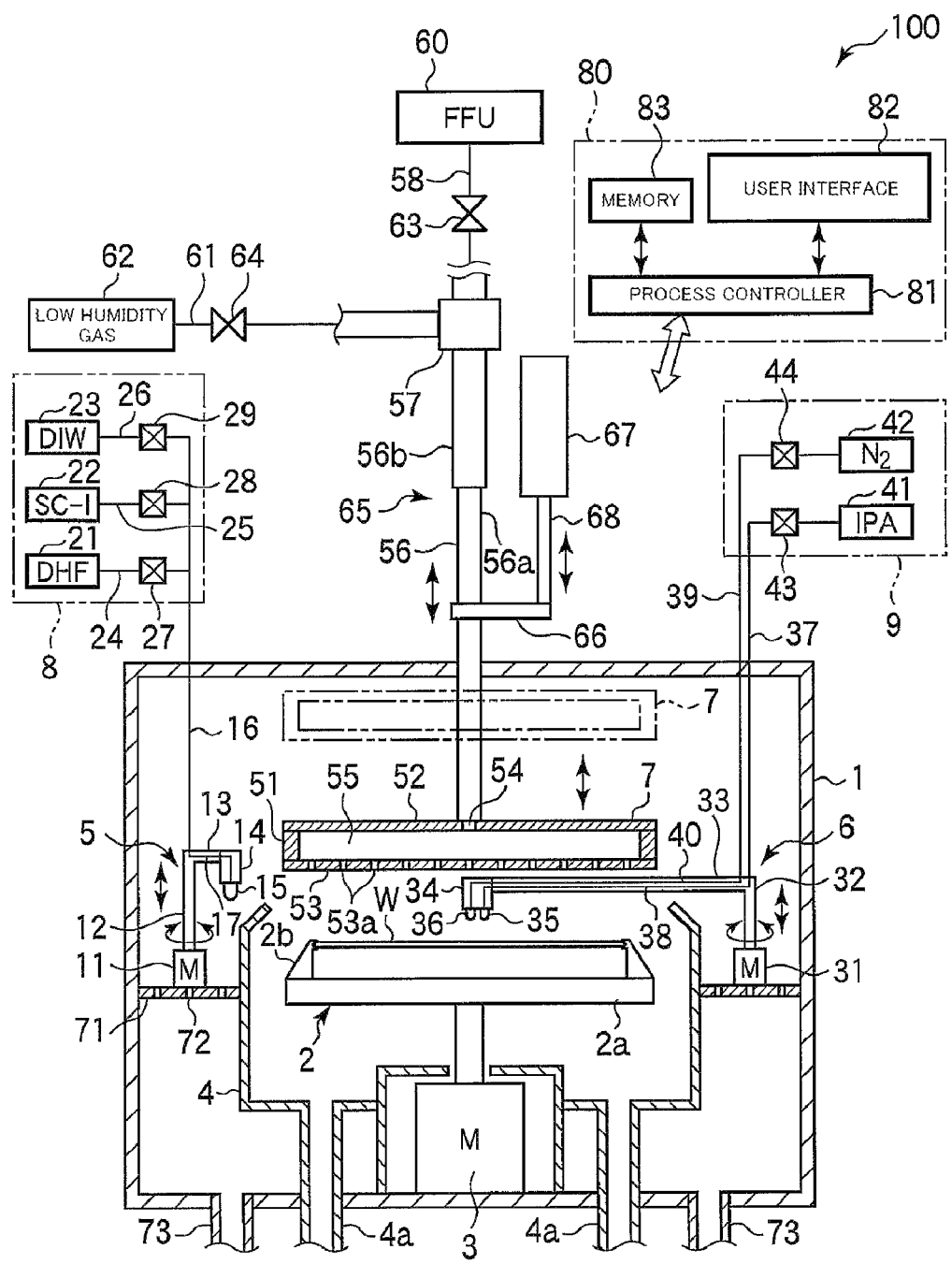
FIG. 1 is a vertical sectional view illustrating a schematic configuration of a wafer cleaning apparatus according to a first example of the present invention.
Figure 2:
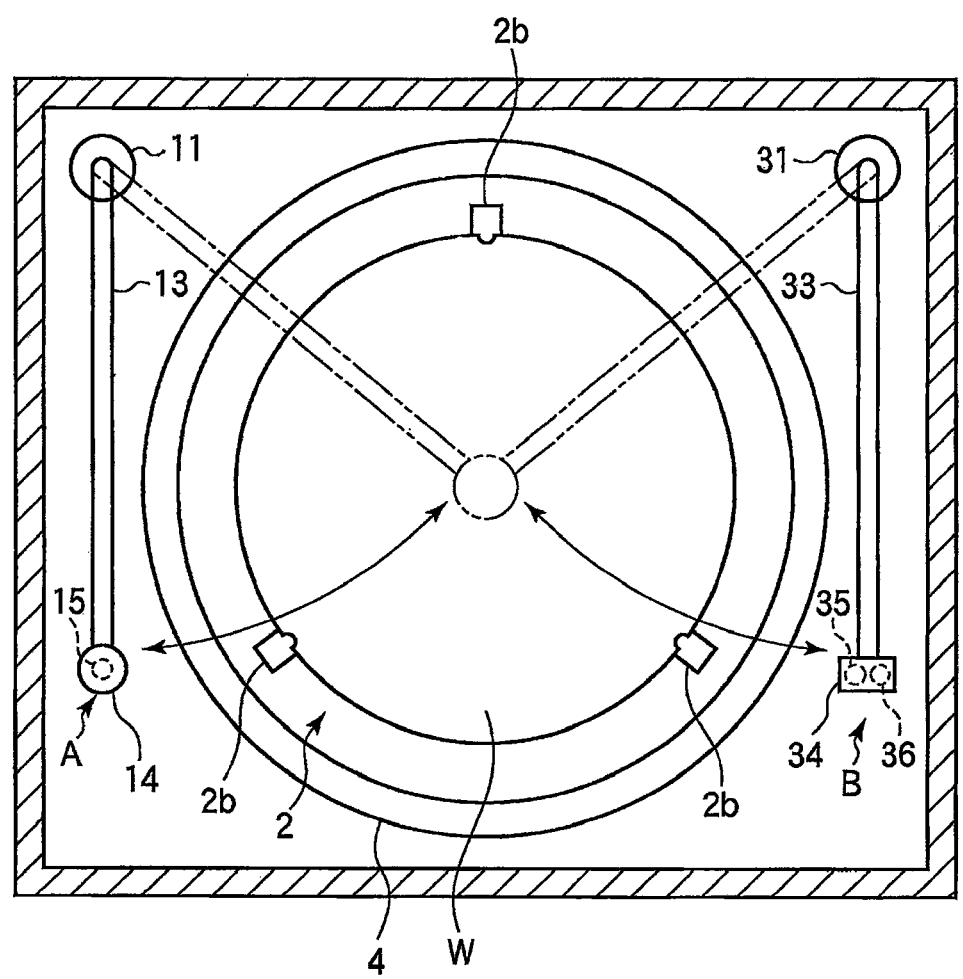
FIG. 2 is a horizontal sectional view illustrating an interior of a chamber of the wafer cleaning apparatus of FIG. 1.

FIG. 1 is a vertical sectional view illustrating a schematic configuration of a wafer cleaning apparatus according to a first example of the present invention. FIG. 2 is a horizontal sectional view illustrating an interior of a chamber of the wafer cleaning apparatus of FIG. 1.

The wafer cleaning apparatus 100 includes a chamber 1. The chamber 1 includes a spin chuck 2 to rotatably sustain a wafer W, which is a target substrate, a rotation motor 3 to rotate the spin chuck 2, an elevation device (not shown) to elevate the spin chuck 2, a cup 4 to prevent scatter of a discharged solution, a processing liquid supply nozzle part 5 to supply a processing liquid to a surface of the wafer W, a dry fluid nozzle part 6 to supply a dry fluid to the surface of the wafer W, and a gas discharge head 7 to selectively supply either a clean air or a low humidity gas into the chamber 1.

The spin chuck 2 includes a holding plate 2a having a circular shape and three holding members 2b provided on an outer periphery of an upper surface of the holding plate 2a. The three holding members 2b have an equal interval between them, and the equal interval allows the holding members 2b to make contact with an edge of the wafer W. Thus, the wafer W can be sustained in a roughly horizontal state.

The cup 4 is provided to surround the spin chuck 2. A gas/solution discharge pipe 4a is provided at the bottom of the cup 4 to discharge a gas/solution. The cup 4 receives the liquid scattered when supplying a processing liquid to a rotating wafer (W), and discharges the scattered liquid to an outside.

The processing liquid supply nozzle part 5 includes a rotation motor 11, a shaft 12 upwardly extended from the rotation motor 11, a nozzle arm 13 horizontally extended from an upper end of the shaft 12, a nozzle head 14 attached to a front end of the nozzle arm 13, and a processing liquid discharging nozzle 15 provided on a front end of the nozzle head 14. The shaft 12 is rotated by the rotation motor 11, and the nozzle arm 13 is rotated through the rotation of the shaft 12 so that the nozzle head 14 can move on the wafer W. When processing liquid is not discharged, the nozzle head 14 can move back to a retreat position (position A of FIG. 2) which is outside the cup 4. Also, the nozzle arm 13 and the nozzle head 14 can be elevated by an elevation device (not shown).

A processing liquid is supplied from a processing liquid supply part 8 through a processing liquid supply pipe 16 and a fluid path 17 provided within the nozzle arm 13. The processing liquid is discharged from the processing liquid discharging nozzle 15.

The processing liquid supply part 8 supplies a processing liquid, such as diluted hydrofluoric acid (DHF) and SC-1 mixture of ammonia, hydrogen peroxide, and a water, as a chemical solution, and a deionized water (DIW) as a rinsing solution. Also, the processing liquid supply part 8 has a DHF supply source 21, a SC-1 supply source 22, and a deionized water supply source 23. Pipes 24, 25, and 26 extend from the DHF supply source 21, the SC-1 supply source 22, and the deionized water supply source 23, respectively. These pipes 24, 25 and 26 are connected to the processing liquid supply pipe 16. Valves 27, 28, and 29 are provided on the pipes 24, 25, and 26, respectively. By operating these valves 27, 28 and 29, any one of DHF, SC-1, and DIW can be selectively discharged from the processing liquid discharging nozzle 15 through the processing liquid supply pipe 16 and the fluid path 17.

The dry fluid nozzle part 6 is positioned at an opposite side of the processing liquid supply nozzle part 5. The dry fluid nozzle part 6 includes a rotation motor 31, a shaft 32 upwardly extended from the rotation motor 31, a nozzle arm 33 horizontally extended from an upper end of the shaft 32, a nozzle head 34 attached to a front end of the nozzle arm 33, an IPA discharging nozzle 35 and a nitrogen gas discharging nozzle 36 provided on an front end of the nozzle head 34. The shaft 32 is rotated through the rotation motor 31, and the nozzle aim 33 is rotated by the rotation of the shaft 32. Accordingly, the nozzle head 34 can move on the wafer W. When a dry fluid is not discharged, the nozzle head 34 can move back to a retreat position (position B of FIG. 2), which is outside the cup 4. Also, the nozzle arm 33 and the nozzle head 34 can be elevated by an elevation device (not shown).

A dry solvent, for example, isopropyl alcohol (IPA), is supplied from a dry fluid supply part 9 through an IPA supply pipe 37 and a fluid path 38 provided within the nozzle arm 33. IPA is discharged from the IPA discharging nozzle 35. Also, a nitrogen gas is supplied from the dry fluid supply part 9 through a nitrogen gas supply pipe 39 and a fluid path 40 provided within the nozzle arm 33. The nitrogen gas is discharged from the nitrogen gas discharging nozzle 36.

The dry fluid supply part 9 includes an IPA supply source 41 and a nitrogen gas supply source 42. The IPA supply pipe 37 and the nitrogen gas supply pipe 39 are connected to the IPA supply source 41 and the nitrogen gas supply source 42, respectively. Valves 43 and 44 are provided on the IPA supply pipe 37 and the nitrogen gas supply pipe 39, respectively. Thus, the discharge of the IPA gas and nitrogen gas can be controlled by opening/closing these valves 43 and 44.

The gas discharging head 7 is provided on an upper side of the spin chuck 2 in such a manner that it can move in an up-down direction. The gas discharging head 7 includes a side wall 51 to have a cylindrical shape with a diameter slightly smaller than the diameter of an upper opening of the cup 4, an upper plate 52 to block an upper opening of the side wall 51, a lower plate 53 to block an lower opening of the side wall 51 and an inner space 55 formed in the gas discharging head 7. The upper plate 52 has a gas introduction hole 54 formed on the upper plate 52. The lower plate 53 has a plurality of gas discharging holes 53a formed on the lower plate 53.

A gas supply pipe 56 is connected to the gas introduction hole 54. The gas supply pipe 56 upwardly extends to the outside the chamber 1, and is connected to a diversion damper 57 as a diversion part. A downflow introduction pipe 58 is connected to an upper part of the diversion damper 57 to introduce the downflow of a clean air from a fan filter unit (FFU) 60. Also, a low humidity gas pipe 61 extends from a low humidity gas supply source 62 and it is connected to the side part of the diversion damper 57. By operating the diversion damper 57, either the clean air introduced from the FFU 60 or the low humidity gas supplied from the low humidity gas supply source 62 is supplied from the gas discharging head 7 into the chamber 1 through the gas supply pipe 56. Closing valves 63 and 64 are provided on the downflow introduction pipe 58 and the low humidity gas pipe 61, respectively. Thus, the supply and block of the flow can be controlled through these pipes 58 and 61. A low humidity gas may include a dry clean air, a dry clean inactive gas, or a dry clean nitrogen gas, which is dehumidified to have a low dew point. The humidity of the low humidity gas may be 10% or less. Also, the humidity of the clean air supplied from the FFU 60 may be about 40% to 45%.

The gas supply pipe 56 has an expandable part 65 on an upper side of the chamber 1. The expandable part 65 expands by receiving the lower pipe 56a of the gas supply pipe 56 within the upper pipe 56b. Also, a driving plate 66 is fixed at the lower pipe 56a, which is a lower side of the expandable part 65. A piston rod 68 of a cylinder 67 is connected to the driving plate 66. Thus, the gas discharging head 7 can be moved up and down in such a manner that the piston rod 68 is inserted and retracted by the cylinder 67. Also, by moving the gas discharging head 7 through the cylinder 67, the gas discharging head 7 can be located at a low humidity gas discharging position (indicated by a solid line) near the spin chuck 2, or at a retreat position (indicated by a chain and double-dashed line) below a ceiling wall of the chamber 1.

Porous plates 71 are installed between an outer side the cup 4 in the chamber 1 and a wall of the chamber 1. The porous plates 71 have a plurality of holes 72 formed thereon, and the rotation motors 11 and 31 are fixed on the porous plates 71. Also, an exhaustion pipe 73 is provided on the bottom of the chamber 1. A clean air or a low humidity gas is discharged from the gas discharging head 7 and is exhausted from the exhaustion pipe 73 through holes 72 formed on the porous plates 71.

Each part of the processing apparatus 100, for example, the rotation motors 3, 11, and 31, the valves 27, 28, 29, 43, 44, 63, and 64, the diversion damper 57, the cylinder 67, the elevation devices of the nozzle parts 5 and 6 are controlled by a control part 80. The control part 80 includes a process controller 81 having a microprocessor (a computer), a user interface 82 connected to the controller 81, and a memory 83 connected to the process controller 81. The memory 83 stores a recipe. The interface 82 has a keyboard allowing a user to perform an input operation, such as input of a control command of the processing apparatus 100, and a display to visualize and display an operation condition of the processing apparatus 100. The recipe has a control program to control each part of the processing apparatus 100 or a program to perform a predetermined process in the processing apparatus 100.

The recipe is memorized in a storage medium of the memory 83. The storage medium may be stationary, such as a hard disc, or may be portable, such as CDROM, DVD or flash memory. The recipe may be transmitted from other device, for example, via a dedicated cable.

If necessary, an arbitrary recipe may be called from the memory 83 through, for example, an indication from the user interface 82. The content of the recipe may be executed in the process controller 81, and a predetermined process may be performed in the wafer cleaning apparatus 100 under the control of the process controller 81.

Figure 3:
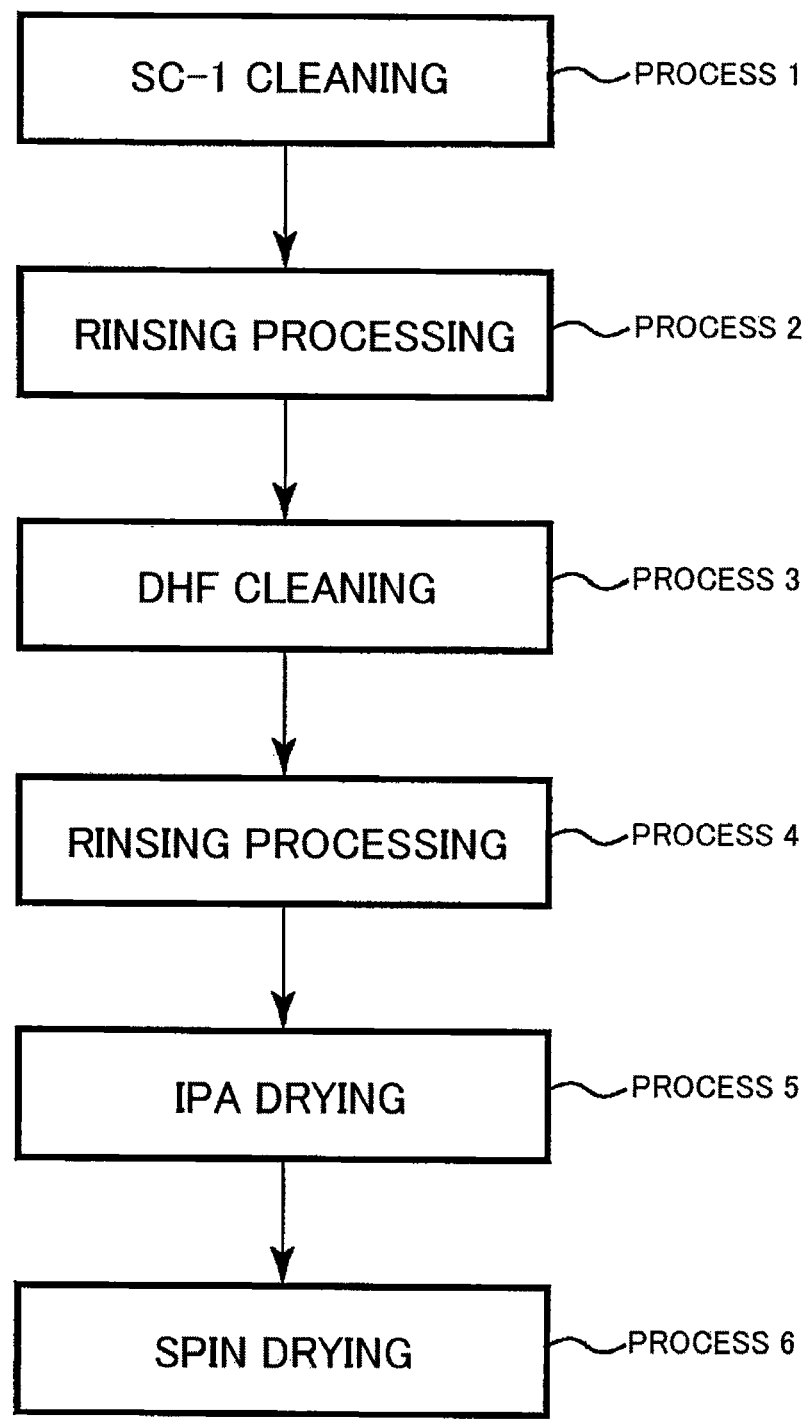
FIG. 3 is a flowchart illustrating an example of a wafer cleaning process of the wafer cleaning apparatus of FIG. 1.

Hereinafter, a processing operation of the wafer cleaning apparatus 100 as described above will be described below. As shown in FIG. 3, a cleaning process is performed according to the order of a SC-1 cleaning (Process 1), a rinsing (Process 2), a DHF cleaning (Process 3), a rinsing (Process 4), a IPA drying (Process 5), a spin drying (Process 6). The SC-1 cleaning is mainly performed to remove an organic solvent or particles, and the DHF cleaning is mainly performed to remove an oxidized film.

Figure 4:
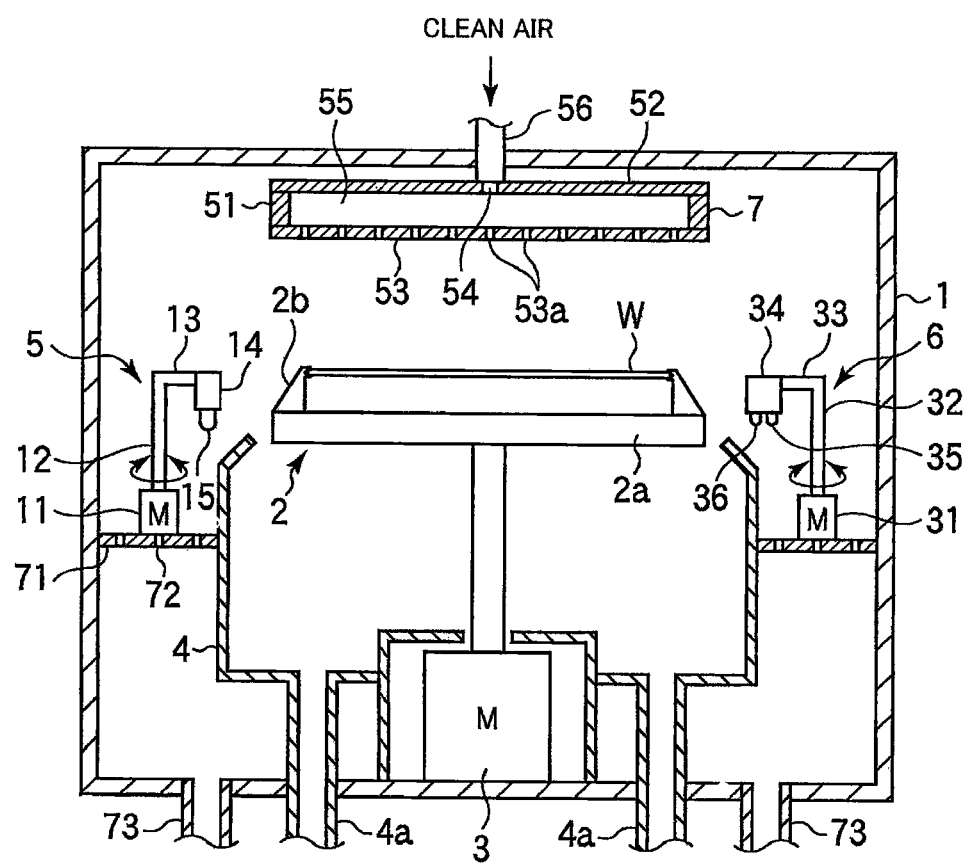
FIG. 4 is a sectional view illustrating the chamber of the wafer cleaning apparatus of FIG. 1, in which a wafer is introduced into a camber.

First, as shown in FIG. 4, the nozzle head 14 of the processing liquid supply nozzle part 5 and the nozzle head 34 of the dry fluid nozzle part 6 are positioned at a retreat position. The gas discharging head 7 is positioned at a retreat position of the upper part of the chamber 1. At this state, the spin chuck 2 is elevated up to a conveying position of an upper side of the cup 4 by the elevation device (not shown), and a conveying arm (not shown) having a wafer W is inserted through a wafer inlet/outlet (not shown). Accordingly, the wafer W is positioned at a transporting position of the upper side of the spin chuck 2, and the wafer W is held by the holding member 2b. At this time, the diversion damper 57 (see FIG. 1) is adjusted to face a clean air side so that clean air is discharged from the gas discharging head 7.

Figure 5:
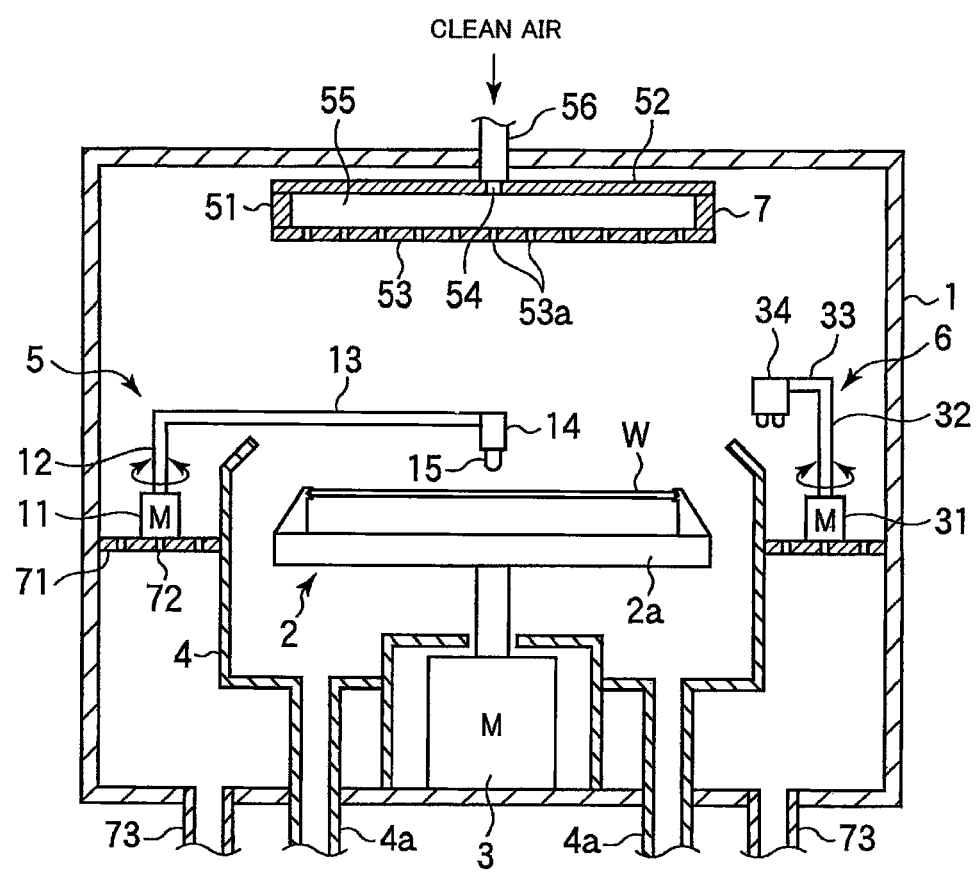
FIG. 5 is a sectional view illustrating the chamber of the wafer cleaning apparatus of FIG. 1, in which a cleaning process is performed.

Then, as shown in FIG. 5, the spin chuck 2 is lowered to a processing position within the cup 4 by the elevation device (not shown). The nozzle head 14 of the processing liquid supply nozzle part 5 is rotated. The processing liquid discharging nozzle 15 is positioned directly above a center of the wafer W, and the nozzle head 14 is lowered to the processing position by a driving device (not shown). Also, if a clean air is allowed to flow from the gas discharging head 7 located at the retreat position while rotating the wafer W together with the spin chuck 2 by the rotation motor 3, the valve 28 is opened, and the valves 27 and 29 are closed. Accordingly, a cleaning chemical solution, such as, SC-1 is supplied from the processing liquid discharging nozzle 15 to the wafer W, and the SC-1 cleaning (Process 1) is performed.

When the SC-1 cleaning has been finished, the rinsing (Process 2) is performed. In the rinsing, a clean air is allowed to flow from the gas discharging head 7 located at the retreat position, and the nozzle 15 is positioned directly above the center of the wafer W. While rotating the wafer W, the valve 29 is opened and the valves 27 and 28 are closed so that a rising solution, such as, deionized water (DIW) is supplied from the processing liquid discharging nozzle 15 to the center of the wafer W. Thus, the deionized water is spread to an entire surface of the wafer W due to a centrifugal force and is separated from the wafer W. In the mean time, SC-1 on the wafer W is washed away from the wafer W.

When the rinsing (Process 2) has been finished, the DHF cleaning (Process 3) is performed. In the DHF cleaning, a clean air is allowed to flow from the gas discharging head 7 located at the retreat position, and the nozzle 15 is positioned directly above the center of the wafer W. While rotating the water W, the valve 27 is opened, and the valves 28 and 29 are closed so that DHF as the cleaning chemical solution is supplied to the center of the wafer W.

Figure 6:
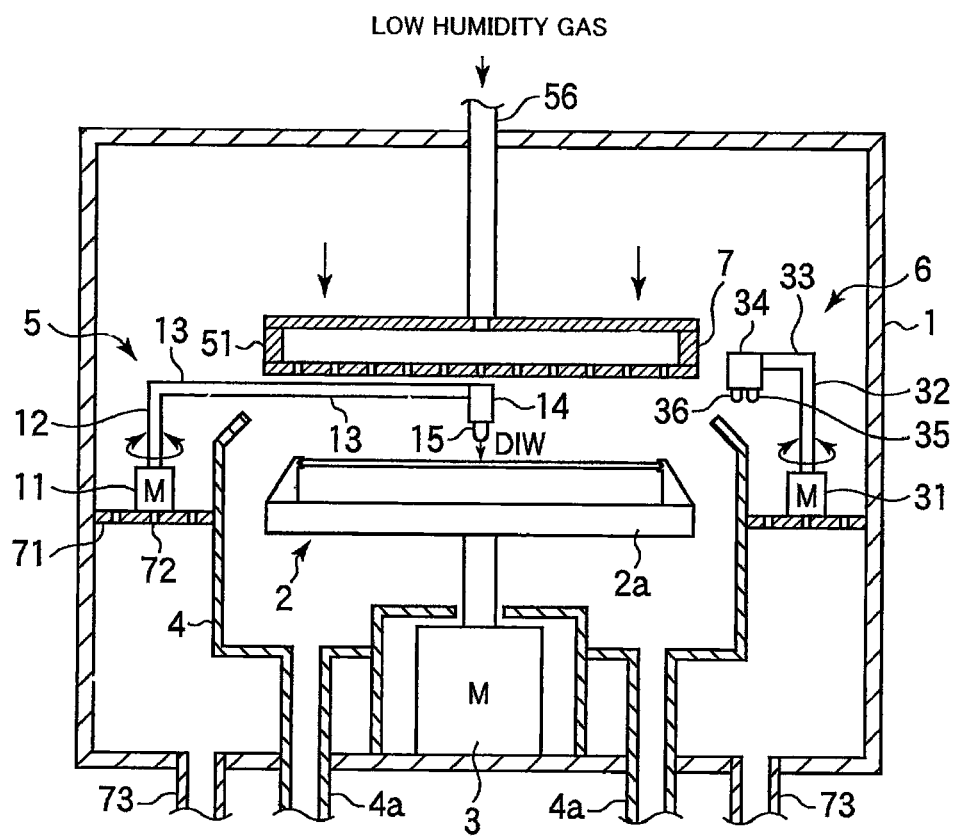
FIG. 6 is a sectional view illustrating the chamber of the wafer cleaning apparatus of FIG. 1, in which a gas discharging head is lowered during a rinsing process but just before an IPA drying process.

When the DHF cleaning (Process 3) has been finished, the rinsing (Process 4) is performed. In the rinsing, a clean air is allowed to flow from the gas discharging head 7 located at the retreat position, and the nozzle 15 is positioned at the center of the wafer W. While rotating the water W, the valve 29 is opened, and the valves 27 and 28 are closed so that deionized water DIW as a rinsing solution is supplied from the processing liquid discharging nozzle 15 to the center of the wafer W. Accordingly, the deionized water is spread to the entire surface of the wafer W due to a centrifugal force and is separated from the wafer W. In the mean time, the DHF on the wafer W is washed away from the wafer W. Also, in order to prepare the IPA drying (Process 5) during the rinsing (Process 4), as shown in FIG. 6, the gas discharging head 7 is lowered to an approach position near the wafer W held by the spin chuck 2, and a diversion damper 57 is adjusted to face a gas side so that a low humidity gas is discharged. This transition timing refers the timing at which the wafer W is surrounded with the low humidity gas at the beginning of the IPA drying.

Figure 7:
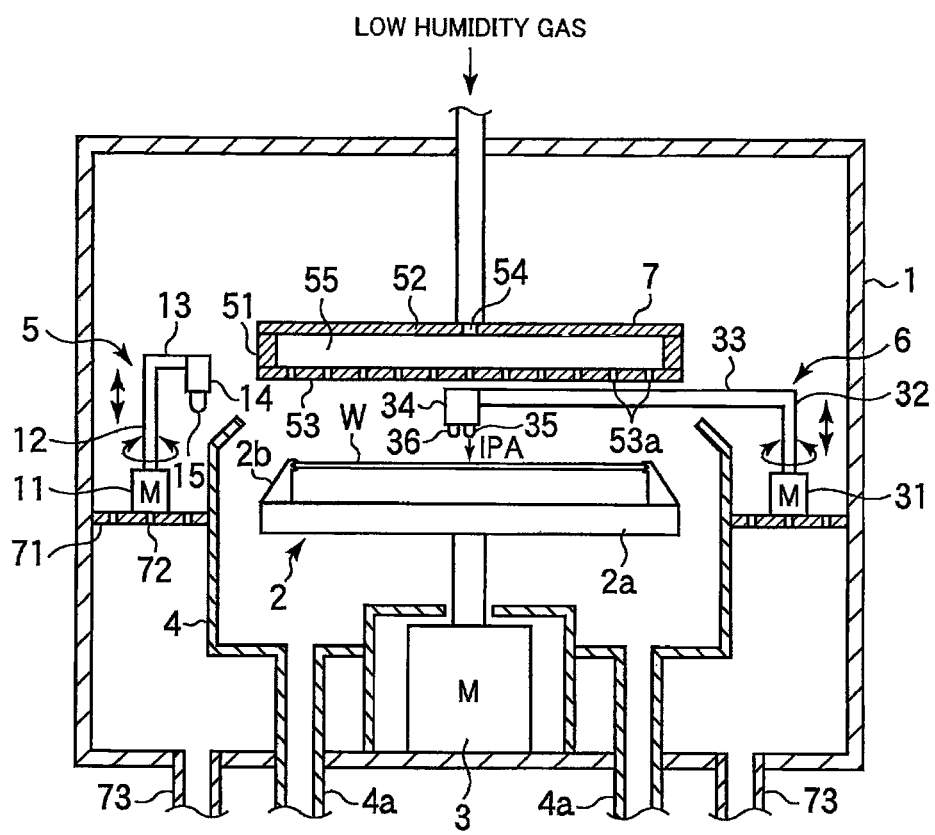
FIG. 7 is a sectional view illustrating the chamber of the wafer cleaning apparatus of FIG. 1, in which an IPA drying process is performed.

When the rinsing (Process 4) has finished, as shown in FIG. 7, while discharging the low humidity gas from the gas discharging head 7 located at the approach position, the nozzle head 14 of the processing liquid supply nozzle part 5 is returned to the retreat position, and the nozzle head 34 of the dry fluid nozzle part 6 is rotated so as to locate the IPA discharge nozzle 35 directly above the center of the wafer W. Also, while rotating the wafer W together with the spin chuck 2 by the rotation motor 3, the valve 43 is opened so that IPA is supplied to the center of the wafer W, and the IPA drying (Process 5) is performed. In the IPA drying, the wafer W is rotated, and IPA is supplied to the center of the wafer W as described above. Thus, IPA is spread to the entire surface of the wafer W due to a centrifugal force. Further, the deionized water on the wafer W is replaced with IPA to form an IPA solution film. As such, the IPA solution film is formed on the entire surface of the wafer W, thereby preventing watermarks or particles from generating on the upper surface of the wafer W due to a natural dry. Then, IPA is scanned from a center of the wafer W toward the corner of the wafer W by the nozzle head 34 while discharged from the IPA discharging nozzle 35. Accordingly, the IPA supplied to the wafer W is scanned from the center of the wafer W to the corner thereof. Therefore, the IPA film formed on the surface of the wafer W can be extruded to the outside the wafer W due to a centrifugal force. Thus, the surface of the wafer W can be dried without stains.

Figure 8:
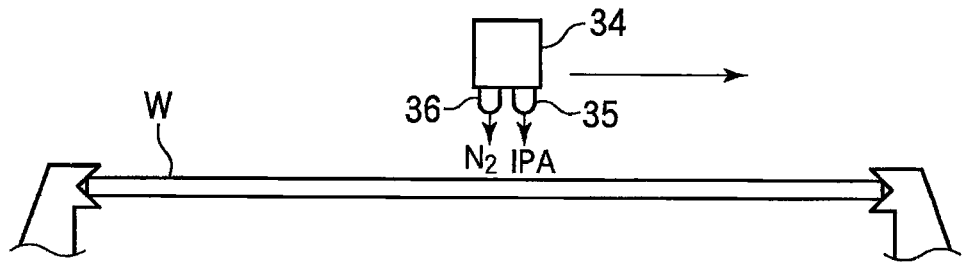
FIG. 8 is a schematic view illustrating the wafer cleaning apparatus of FIG. 1 in which a nitrogen gas is discharged when IPA is discharged and scanned during an IPA drying process.

As shown in FIG. 8, when IPA is scanned from the center of the wafer W to the corner of the wafer W, a nitrogen gas is discharged from the nitrogen gas discharging nozzle 36 so that the nitrogen gas follows the IPA being scanned. Therefore, the surface of the wafer W can be effectively dried without stains.

If a wafer W is cleaned with a hydrophobic cleaning solution, such as, DHF and thus the surface of the wafer W becomes hydrophobic, watermarks are easily generated. The IPA drying will be effective in drying such a wafer W.

Typically, a clean air has about 40% humidity. In such an atmosphere, IPA absorbs humidity. Thus, a drying cannot be sufficiently performed, and watermarks cannot be completely removed. Therefore, the IPA drying is performed while supplying a low humidity gas, such as, a dry clean air. However, in the conventional way, a low humidity gas has been supplied only by changing a gas into a low humidity gas through a clean air introduction hole of an upper part of a chamber. However, a dehumidification process of the low humidity gas takes time, and the low humidity gas is expensive. Thus, in order to supply a low humidity gas from the upper part of the chamber, a large amount of the low humidity gas must be required, which has caused an increased cost.

However, according to the present invention, the gas discharging head 7 is configured to move up and down. The gas discharging head 7 is lowered to be near the wafer W when a low humidity gas is supplied during the IPA drying. This can reduce the apparent volume of distribution of the chamber supplying the low humidity gas. Accordingly, an amount of the low humidity gas to be used can be reduced. Also, the volume for supplying the low humidity gas can be reduced as described above. Thus, the time for replacing a clean air in atmosphere around the wafer W with the low humidity gas can be reduced, thereby improving a throughput.

Also, a typical clean air is supplied during a chemical solution processing because the cost for an expensive low humidity gas can be reduced. Further, it is because that, if the chemical solution processing is performed in an atmosphere with low humidity, the evaporation of moisture included in the chemical solution is accelerated so that concentration of the chemical solution increases, and the control the cleaning processing is not easy. Also, it is because that when recycling the chemical solution, the concentration of the chemical solution gradually increases. Moreover, the gas discharging head 7 is positioned at the retreat position of the upper part of the chamber 1, because a downflow can be formed within the chamber 1 when a clean air is discharged, and a chemical solution, such as SC-1 or DHF, can be prevented from adhering to the gas discharging head 7.

In order to more completely dry the wafer W after the IPA drying (Process 5) has been finished, a spin drying (Process 6) may be performed while supplying the low humidity gas. At this time, the nozzle head 34 of the dry fluid nozzle part 6 is located at the retreat position, and the nozzle heads 14 and 34 are retracted while the wafer W is rotated.

Figure 9:
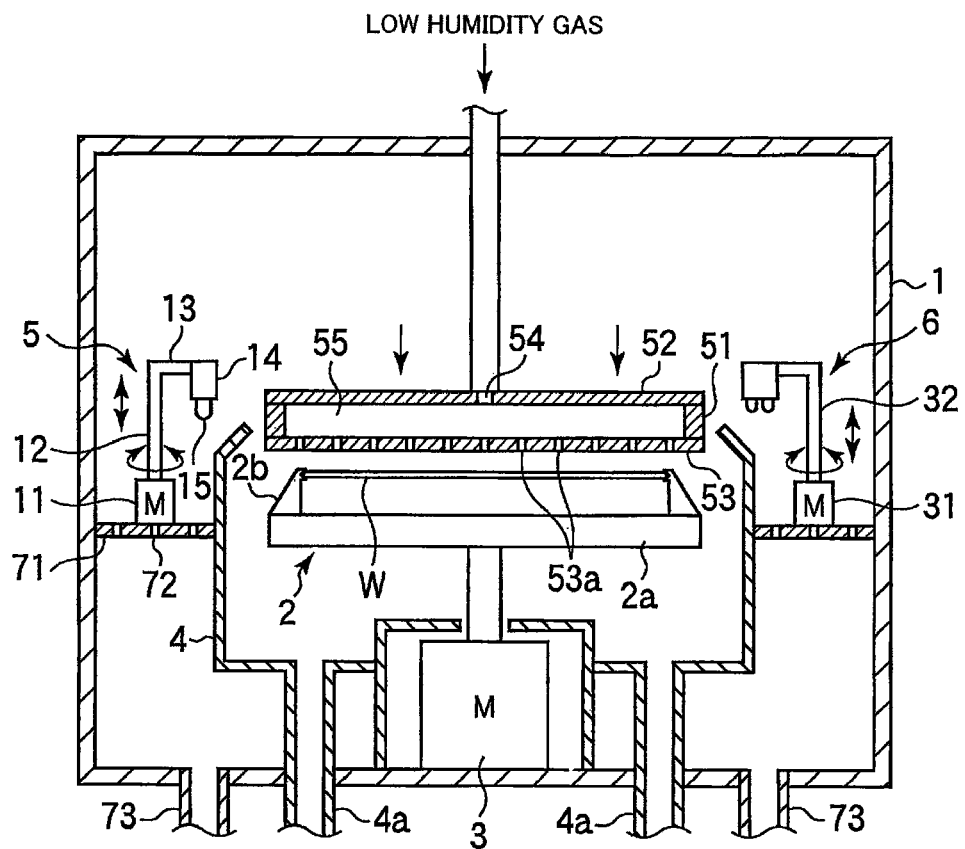
FIG. 9 is a sectional view illustrating the chamber of the wafer cleaning apparatus of FIG. 1, in which a spin drying process is performed.

In this case, a nozzle does not exist at the upper side of the wafer W. Therefore, as shown in FIG. 9, the gas discharging head 7 can be further lowered to be closer to the wafer W. As such, an amount of the low humidity gas to be used can be reduced by positioning the gas discharging head 7 described above.

Figure 10:
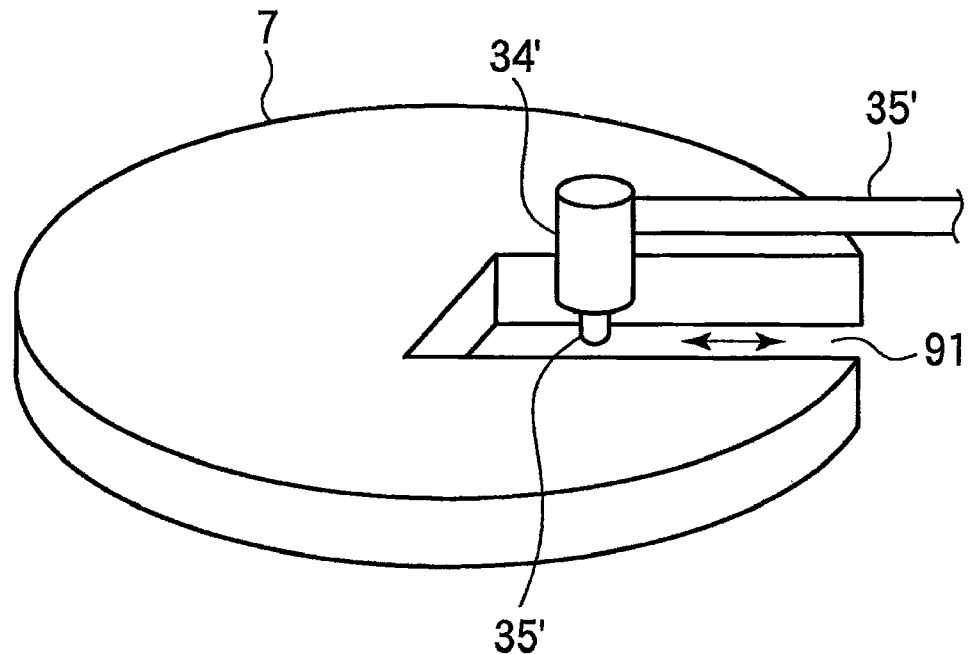
FIG. 10 is a perspective view illustrating a gas discharging head and a nozzle part to discharge IPA in the wafer cleaning apparatus of FIG. 1 according to another first example of the present invention.

Also, in the apparatus of FIG. 1, the IPA discharging nozzle 35 is attached to the nozzle head 34, and the nozzle head 34 can rotate through the nozzle arm 33. Because of this, the gas discharging head 7 can be lowered only to a position where the gas discharging head 7 does not interfere with the nozzle arm 33 during the IPA drying. Meanwhile, in order to further reduce the amount of the low humidity gas to be used, the gas discharging head 7 may be further lowered. As shown in FIG. 10, a cutout 91 is formed at the gas discharging head 7 in such a manner that the cutout 91 directs from the center of the gas discharging head 7 towards an edge thereof. Therefore, IPA can be supplied in such a manner that a nozzle head 34' attached onto an IPA discharging nozzle 35' is scanned along the cutout 91 through the nozzle arm 33'. In this case, even though the gas discharge nozzle 7 is positioned near the wafer W, the scanning of the nozzle head 34' is not interrupted. Also, a nitrogen gas discharge nozzle may be provided at the nozzle head 34' to allow a nitrogen gas to follow the scanned IPA.

Figure 11:
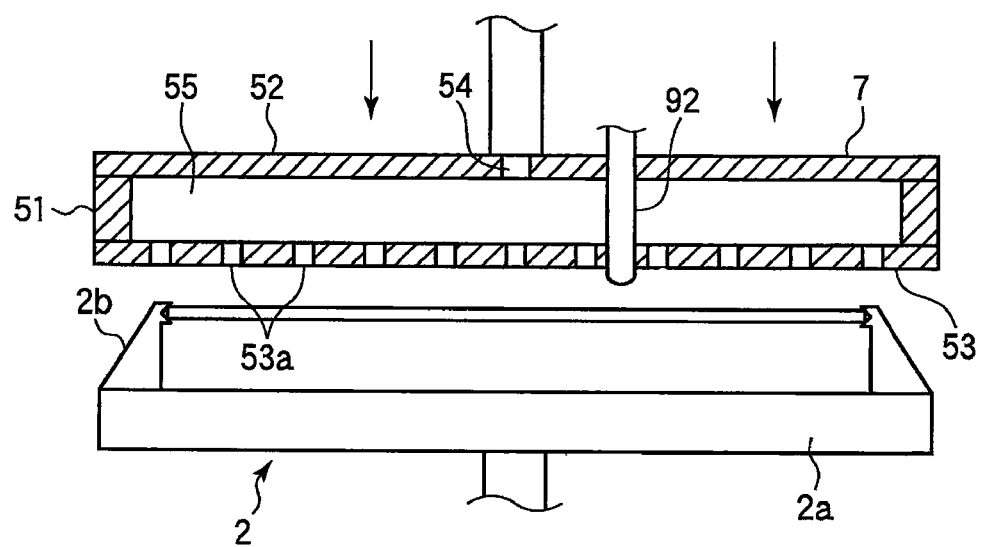
FIG. 11 is a sectional view illustrating a gas discharging head in the wafer cleaning apparatus of FIG. 1 according to still another first example of the present invention.

Moreover, as shown in FIG. 11, the IPA discharging nozzle 92 is attached onto the gas discharge head 7 so that IPA is discharged from the IPA discharging nozzle 92. Therefore, without considering the interference with the nozzle arm, the gas discharging head 7 can approach the wafer W as near as possible. However, in this case, the IPA discharging nozzle 92 cannot be scanned.

In the example of FIGS. 10 and 11, when the gas discharging head approaches the wafer W so as to prepare the IPA drying during the rinsing (Process 4), a solution is sprung and adheres to the gas discharging head during the rinsing, so that this may cause particles. Therefore, the gas discharging head may be located at a middle position, thereby making the adherence of the sprung solution to the gas discharging head difficult.

Second Example

Figure 12:
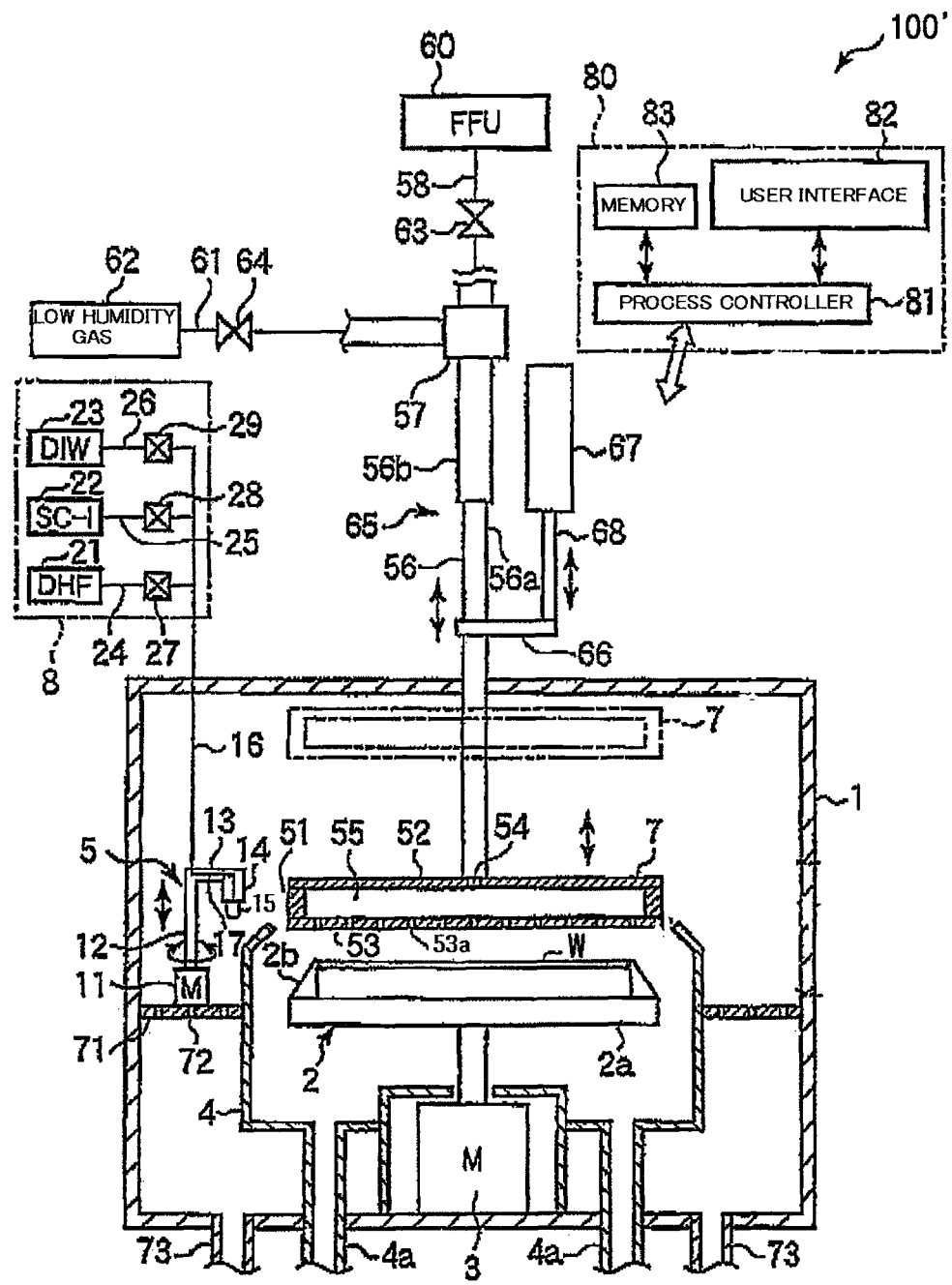
FIG. 12 is a vertical sectional view illustrating a schematic configuration of a wafer cleaning apparatus according to a second example of the present invention.

FIG. 12 is a vertically sectional view illustrating a schematic configuration of a wafer cleaning apparatus according to a second example of the present invention.

The wafer cleaning apparatus 100' has a configuration similar to the configuration of wafer cleaning apparatus 100 of FIG. 1, except that the dry fluid nozzle part 6 and the dry fluid supply part 9 do not exist.

Figure 13:
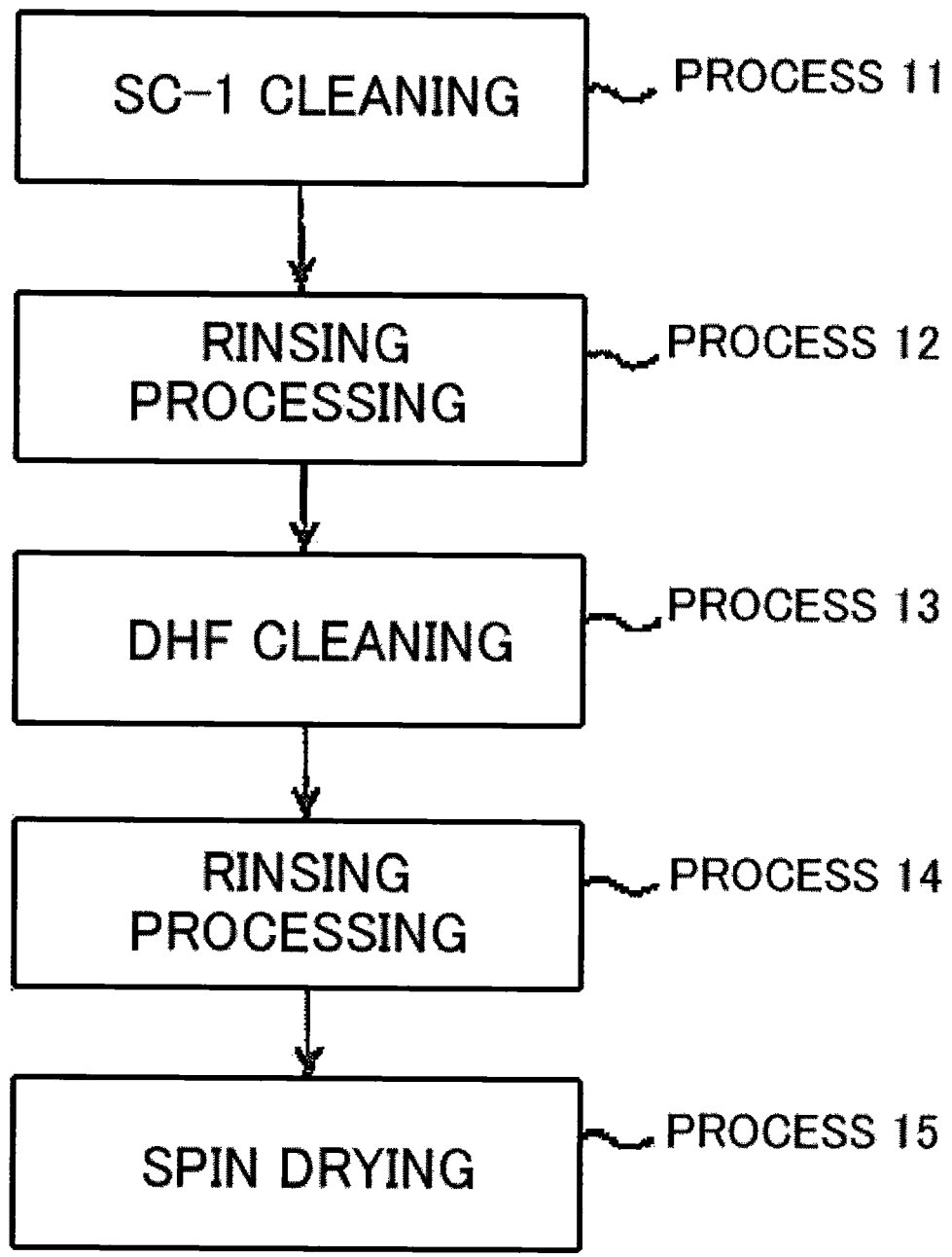
FIG. 13 is a flowchart illustrating an example of a wafer cleaning process of the wafer cleaning apparatus of FIG. 12.

As shown in FIG. 13, in the wafer cleaning apparatus 100', a cleaning process is performed according to an order of a SC-1 cleaning (Process 11), a rinsing (Process 12), a DHF cleaning (Process 13), a rinsing (Process 14), and a spin drying (Process 15). This cleaning process sequence is different from that of the first example in that the second example does not have the IPA drying.

Similarly to the Processes 1 to 3, the Processes 11 to 13 are performed in the order s identical to those of the Processes 1 to 3. For example, the gas discharging head 7 is positioned at the retreat position of the upper side of the chamber 1 as shown in FIG. 5 and a clean air is discharged from the gas discharging head. Similarly to the Process 4, the rinsing (Process 14) is performed in the order identical to that of the Process 4. For example, the gas discharging head 7 is positioned at the retreat position of the upper part of the chamber 1 until a half of the Process 14 is performed, and a clean air is discharged from the discharging head 7. Then, as shown in FIG. 6, in order to prepare the subsequent drying process, the gas discharging head 7 is lowered to the position adjacent to the wafer W held by the spin chuck 2, and the diversion damper 57 is adjusted to face a low humidity gas side so that the low humidity gas is discharged. This transition timing refers to a timing at which the surroundings of the wafer W is replaced with a low humidity gas at the beginning the drying.

Figure 14:
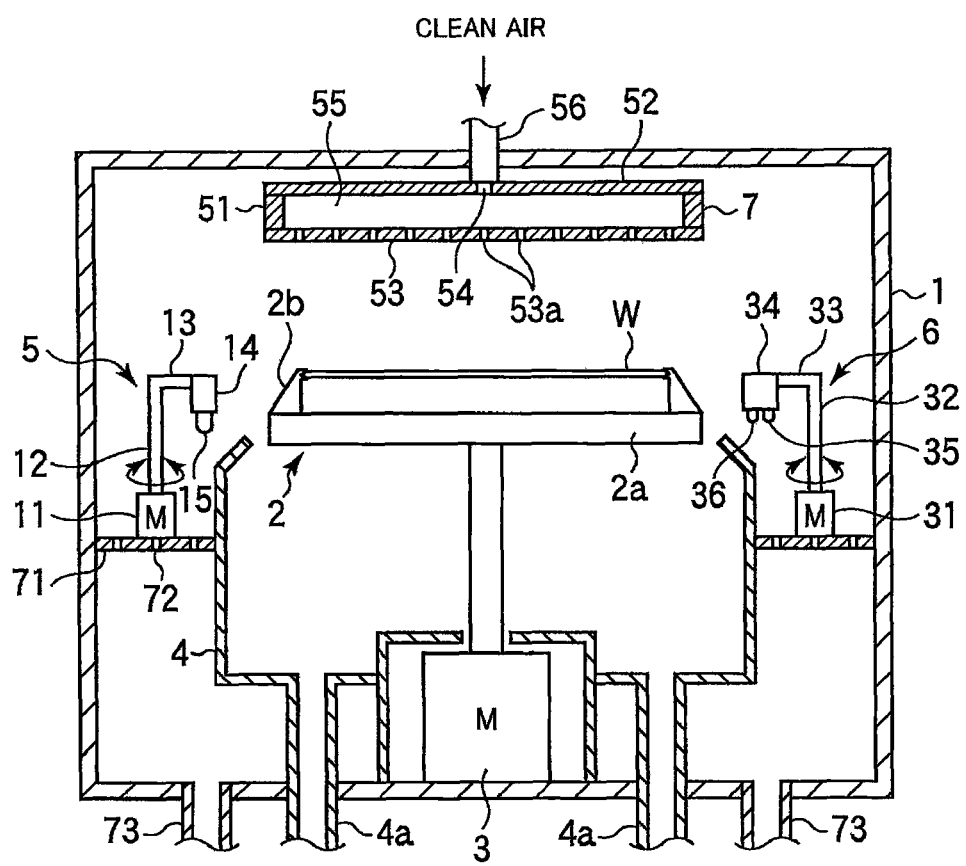
FIG. 14 is a view showing the chamber of the wafer cleaning apparatus of FIG. 12, in which a gas discharging head is lowered during a spin drying process.

As shown in FIG. 14, when the rinsing has been finished, the nozzle head 14 of the processing liquid supply nozzle part 5 is moved back to the retreat position, and the gas discharging head 7 is further lowered so that it approaches an apparent position close to the wafer W. In a state where a low humidity gas is discharged from the gas discharging head 7, the wafer W together with the spin chuck 2 is rotated by the rotation motor 3. As such, the spin drying (Process 15) is performed. In the spin drying, as the low humidity gas is discharged from the gas discharging head 7, the evaporation of the solution on the wafer W is promoted. Thus, watermarks or particles can be prevented from forming on the upper side of the wafer W. The generation of watermarks or particles can be prevented by performing the IPA drying as described in the first example, or only by discharging a low humidity gas as described in the second example.

Figure 15:
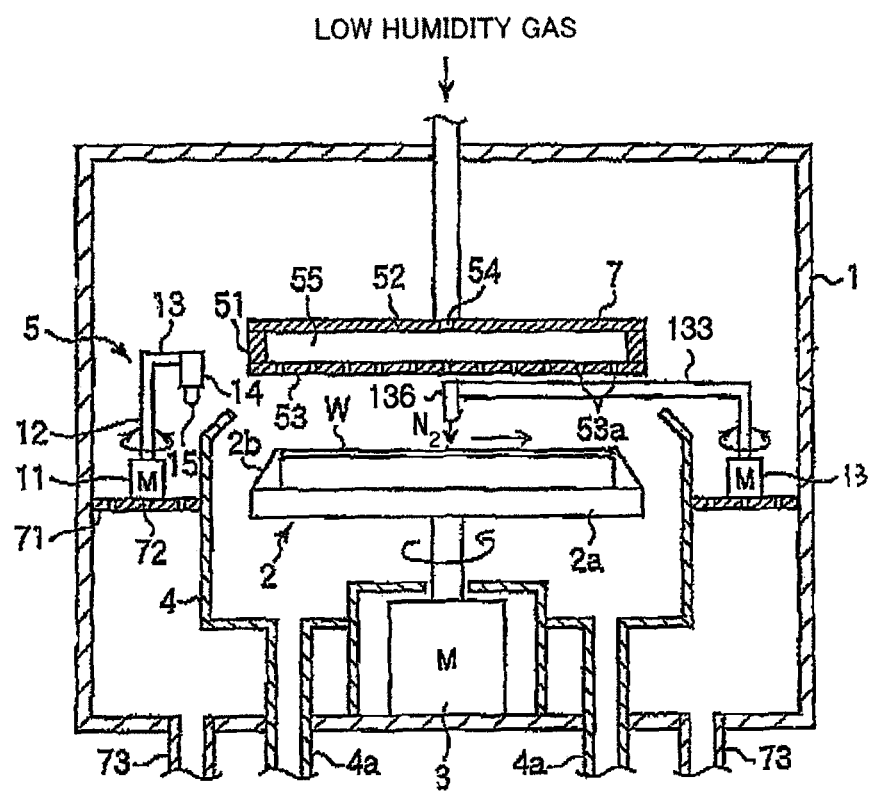
FIG. 15 is a view illustrating the chamber of the wafer cleaning apparatus of FIG. 12, in which a spin drying is performed while a nitrogen gas is scanned.

In order to surely prevent generation of watermarks or particles by drying the solution on the wafer W without stains, as shown in FIG. 15, a nitrogen gas nozzle 136 may be provided on a front end of the nozzle arm 133. The nozzle arm 133 is rotated by a motor 131 so that a scanning can be performed through the nitrogen gas nozzle 136. Also, in the spin drying (Process 15), the scanning of nitrogen gas may be performed from the center of the gas discharging head 7 to the edge. Similarly to the case shown in FIG. 10, a cutout may be formed on the gas discharging head 7. The cutout directs from the center of the gas discharging head 7 to the edge thereof. A scanning is performed along the cutout through the nitrogen gas nozzle 136 so that nitrogen gas is discharged. Therefore, the gas discharging head 7 can be further lowered, thereby further reducing an amount of low humidity gas to be used.

The present invention is not limited to the above described examples, and can be variously modified. For example, according to some examples, the IPA drying is performed after the SC-1 cleaning and the DHF cleaning. Further, the present invention can be modified such that only SC-1 cleaning and DHF cleaning are performed. Also, the present invention can be still further modified such that the IPA drying is performed after another chemical solution process.

Moreover, although IPA is used as a dry solvent in the above examples, any solvent may be used as a dry solvent. Also, although the present invention is described to be applied to a wafer cleaning, the present invention is not limited to a cleaning. The present invention may be applied to any process in which a processing liquid is dried by using a dry solvent after a processing process. In addition, although a low humidity gas is mostly used in a IPA drying and a spin drying in the above described examples, a low humidity gas may be used at least in performing a drying process by using a dry solvent, such as, IPA.

Moreover, although a semiconductor wafer is used as the substrate in the above described examples, a substrate is not limited to a semiconductor wafer, and the present invention can be also applied to process other substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A substrate processing apparatus, comprising:
a chamber to receive a substrate;
a substrate holding part to horizontally hold the substrate within the chamber;
a rotating device to rotate the substrate holding part;
a gas discharging head provided on an upper side of the substrate holding part within the chamber and configured to selectively move up and down between a retreat position at an upper part of the chamber and an approach position near the substrate held by the substrate holding part according to a current process, the gas discharging head selectively discharging either a dehumidified gas or a clean air into a lower side in the chamber;
a gas supplying device to supply either the dehumidified gas or the clean air to the gas discharging head;
a driving device to move the gas discharging head between the retreat position and the approach position;
a processing liquid supply nozzle to supply a processing liquid to the substrate;
a dry organic solvent supply nozzle formed separately from the processing liquid nozzle to supply a dry organic solvent to the substrate; and a control part configured to control the gas discharging head, the gas supplying device, the driving device, the processing liquid supply nozzle and the dry organic solvent supply nozzle, wherein the control part controls the gas discharging head, the gas supplying device, the driving device, the processing liquid supply nozzle and the dry organic solvent supply nozzle such that the processing liquid is supplied from the processing liquid supply nozzle to the substrate to perform liquid processing of the substrate, and a series of processes is performed to dry the substrate by supplying the dry organic solvent from the dry organic solvent supply nozzle to the substrate, the gas discharging head moves from the retreat position to the approach position while the processing liquid supply nozzle supplies the processing liquid to the substrate and starts to supply the dehumidified gas to the substrate before the dry organic solvent is supplied to the substrate, and the gas discharging head is positioned at the retreat position to supply the clean air from the gas discharging head to the substrate when the dehumidified gas is not supplied to the substrate.

2. The apparatus of claim 1, wherein the dry organic solvent supply nozzle is scanned from a center of the substrate to an edge of the substrate and discharges the dry organic solvent while the substrate is rotated.

3. The apparatus of claim 2, further comprising a nitrogen gas nozzle provided near the dry organic solvent supply nozzle, and wherein the scan of a nitrogen gas follows the scan of the dry organic solvent, when the dry organic solvent supply nozzle is scanned from the center of the substrate to the edge of the substrate and discharges the dry organic solvent while the substrate is rotated.

4. The apparatus of claim 1, wherein after the dry organic solvent is supplied from the dry organic solvent supply nozzle to the substrate to dry the substrate, a spin drying is performed in a state where no nozzle exists on the substrate, and wherein the gas discharging nozzle approaches closer to the substrate.

5. The apparatus of claim 1, wherein the gas discharging head includes a cutout which can be scanned by the dry organic solvent supply nozzle, and wherein when the gas discharging head is positioned at the approach position, the dry organic solvent supply nozzle scans an inside of the cutout.

6. The apparatus of claim 1, wherein the dry organic solvent supply nozzle is attached onto the gas discharging head.

7. A substrate processing apparatus, comprising:
a chamber to receive a substrate;
a substrate holding part to horizontally hold the substrate within the chamber;
a rotating device to rotate the substrate holding part;
a gas discharging head provided on an upper side of the substrate holding part within the chamber and configured to selectively move up and down between a retreat position at an upper part of the chamber and an approach position adjacent to the substrate held by the substrate holding part according to a current process, the gas discharging head selectively discharging either a dehumidified gas or a clean air to a lower side within the chamber;
a gas supplying device to supply either of the dehumidified gas or the clean air to the gas discharging head;
a driving device to move the gas discharging head between the retreat position and the approach position;
a processing liquid supply nozzle to supply a processing liquid to the substrate; and
a control part configured to control the gas discharging head, the gas supplying device, the driving device and the processing liquid supply nozzle,
wherein the control part controls the gas discharging head, the gas supplying device, the driving device and the processing liquid supply nozzle such that the processing liquid is supplied from the processing liquid supply nozzle to the substrate to perform liquid processing of the substrate, and a series of processes is performed to dry the substrate while rotating the substrate, the gas discharging head moves from the retreat position to the approach position while the processing liquid supply nozzle supplies the processing liquid to the substrate and starts to supply the dehumidified gas to the substrate before the substrate is being dried, and the gas discharging head is positioned at the retreat position to supply the clean air from the gas discharging head to the substrate when the dehumidified gas is not supplied to the substrate.

8. The apparatus of claim 7, further comprising a nitrogen gas nozzle configured to scan, and wherein the scan of the nitrogen gas nozzle is performed from a center of the substrate to an edge of the substrate while rotating the substrate, when the substrate is dried.

9. The apparatus of claim 8, wherein the gas discharging head includes a cutout which can be scanned by the nitrogen gas nozzle, and wherein when the gas discharging head is positioned at the approach position, the nitrogen gas nozzle scans the inside the cutout.

* * * * *